United States Patent
Hamada et al.

(12) 
(10) Patent No.: US 6,387,546 B1
(45) Date of Patent: May 14, 2002

(54) ORGANIC ELECTROLUMINESCENT DEVICE

(75) Inventors: Yuji Hamada, Nara; Hiroshi Kanno, Osaka; Tsuyoshi Tsujioka, Osaka; Tatsuro Usuki, Osaka, all of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/313,209

(22) Filed: May 18, 1999

(30) Foreign Application Priority Data

May 19, 1998 (JP) .......................... 10-136988
Sep. 22, 1998 (JP) .......................... 10-267927
May 11, 1999 (JP) .......................... 11-130177

(51) Int. Cl.$^7$ .............................. H05B 33/14
(52) U.S. Cl. ................. 428/690; 428/917; 428/704; 428/212; 313/504; 313/506
(58) Field of Search ................ 428/690, 704, 428/917, 212; 313/504, 506

(56) References Cited

U.S. PATENT DOCUMENTS 5,601,903 A * 2/1997 Fujii et al. .............. 428/212
5,645,948 A * 7/1997 Shi et al. ................ 428/690
5,989,737 A * 11/1999 Xie et al. ................ 428/690

OTHER PUBLICATIONS

Tang et al, "Electroluminescence of Doped Organic Thin Films", J. Appl. Phys. 65 (9), May 1, 1989, pp. 3610–3616.
Takeuchi et al, "Effects of Anthracene Doping on Electrical and Light–Emitting Behavior of 8–Hydroxyquinoline–Aluminum–Based Electrodluminescent Devices", Jpn. J. Appl. Phys. vol. 31 (1992) pp. L498–L500.
Arai et al, "Electroluminescence of Violanthrone obtained by Vacuum–Deposition of 3, 3'–dibenzanthronyl", J. Photopolym. Sci. Technol., vol. 7, No. 1, 1994, pp. 103–106.
Kido et al, "White Light–Emitting Organic Electroluminescent Devices using the Poly(N–vinylcarbazole) Emitter Layer Doped with Three Fluorescent Dyes", Appl. Phys. Lett., vol. 64, No. 7, Feb. 14, 1994, pp. 815–817.

* cited by examiner

*Primary Examiner*—Cynthia H. Kelly
*Assistant Examiner*—Ling Xu
(74) *Attorney, Agent, or Firm*—Armstrong, Westerman & Hattori, LLP (57) ABSTRACT

In an organic electroluminescent device having a carrier transport layer and an emitting layer which are composed of an organic material provided between a hole injection electrode and an electron injection electrode, a dopant for transporting carriers is doped into the carrier transport layer and/or a dopant for transporting carriers or moving excitation energy is doped into the emitting

5 Claims, 4 Drawing Sheets

ORGANIC ELECTROLUMINESCENT DEVICE

BACKGROUND OF THE INVENTION

1. Field of the Invention

The present invention relates generally to an organic electroluminescent device, and more particularly, to an organic electroluminescent device characterized in that light having a high luminance can be stably emitted, and light having a predetermined color can be emitted.

2. Description of the Related Art

In recent years, the needs of flat panel display devices, the consumption of electric power and the size of which are smaller than those of a CRT (Cathode Ray Tube) which has been heretofore generally employed, have been increased as information equipments are diversified, for example. An electroluminescent device has been paid attention to as one of the flat panel display devices.

The electroluminescent device is roughly divided depending on a used material, that is, roughly divided into an inorganic electroluminescent device using an inorganic material and an organic electroluminescent device using an organic material.

The organic electroluminescent device is so adapted that holes injected from a hole injection electrode and electrons injected from an electron injection electrode are recombined with each other in the interface between an emitting layer and a carrier transport layer and in the emitting layer, and has the advantage that it can be driven at a lower voltage, as compared with the inorganic electroluminescent device.

In the case of the organic electroluminescent device, a light emitting device emitting light in a suitable color can be obtained by selecting a luminescent material. It is expected that the organic electroluminescent device can be also utilized as a multi-color or full-color display device, for example.

In recent years, various studies have been conducted on such an organic electroluminescent device.

In such an organic electroluminescent device, an emitting layer and a carrier transport layer which is constituted by a hole transport layer for transporting holes to the emitting layer and an electron transport layer for transporting electrons thereto are generally provided between the hole injection electrode and the electron injection electrode.

Generally used as the structure of the organic electroluminescent device are a three-layer structure referred to as a DH structure obtained by laminating a hole transport layer, an emitting layer and an electron transport layer between a hole injection electrode and an electron injection electrode, a two-layer structure referred to as an SH-A structure obtained by laminating a hole transport layer and an emitting layer between a hole injection electrode and an electron injection electrode, and a two-layer structure referred to as an SH-B structure obtained by laminating an emitting layer and an electron transport layer between a hole injection electrode and an electron injection electrode.

An electrode material having a large work function, for example, gold or an indium-tin oxide is used as the hole injection electrode, and an electrode material having a small work function, for example, Mg is used as the electron injection electrode.

An organic material having the property of a p-type semiconductor is used as a hole transporting material in the hole transport layer, and an organic material having the property of an n-type semiconductor is used as an electron transporting material composing the electron transport layer. The property of a material composing the emitting layer is determined depending on the device structure of the organic electroluminescent device. For example, the material having the property of the n-type semiconductor, the material having the property of the p-type semiconductor, and the material having the property close to neutrality are respectively used in the SH-A structure, the SH-B structure, and the DH structure.

Conventionally, a chelate metal complex such as tris(8-quinolinolato)aluminum (hereinafter referred to as $Alq_3$) indicated by the following structural formula 1 has been generally used as the electron transporting material composing the electron transport layer.

(1)

$Alq_3$

The above-mentioned chelate metal complex is superior in film stability, but does not have sufficient electron transporting properties. In order to transport electrons in sufficient quantity to emit light having a high luminance, a driving voltage to be applied to the organic electroluminescent device must be increased.

Conventionally used as the hole transporting material composing the hole transport layer is a material having a phenylamine structure such as N,N'-diphenyl-N,N'-di(3-methylphenyl)-1,1'-diphenyl-4,4'-diamine (hereinafter abbreviated as TPD) indicated by the following structural formula (2).

(2)

TPD

Although the above-mentioned material having a phenylamine structure is superior in hole transporting properties to some extent, the hole transporting properties are not necessarily sufficient.

Although the electron transport layer has the properties of transporting electrons, and the hole transport layer has the properties of transporting holes, they are very poor in the properties of transporting carriers.

Therefore, holes and electrons are respectively stored in the interface between the electron transport layer and the emitting layer and the interface between the hole transport layer and the emitting layer. Consequently, the luminescent properties, the life, and the like of the organic electroluminescent device are reduced.

The material composing the emitting layer is generally low in the properties of transporting electrons and holes. Therefore, electrons and holes are not sufficiently injected into the emitting layer, so that sufficient luminance cannot be obtained.

Conventionally used as the organic electroluminescent device is one obtained by doping a dopant having high luminescent properties into a host material in an emitting layer to obtain sufficient luminance.

Excitation energy is not satisfactorily moved to the dopant from the host material depending on the types of the host material and the dopant which are used for the emitting layer. Therefore, sufficient luminance may not, in some cases, be obtained.

Furthermore, the host material also emits light in addition to the dopant depending on the types of the host material and the dopant which are used for the emitting layer, so that light having a suitable color cannot be emitted. Particularly, it is very difficult to emit red light having a high luminance and having a high color purity.

SUMMARY OF THE INVENTION

An object of the present invention is to increase hole transporting properties in a hole transport layer and electron transporting properties in an electron transport layer while maintaining film stability in the hole transport layer and the electron transport layer, to make it possible to stably emit light having a high luminance.

Another object of the present invention is to make it easy to inject electrons and holes into an emitting layer, to make it possible to emit light having a high luminance.

Still another object of the present invention is to satisfactorily move excitation energy from a host material in an emitting layer to a dopant having luminescent properties, to emit light having a high luminance.

A further object of the present invention is to prevent a host material from emitting light in addition to a dopant in an emitting layer, to emit light in a suitable color.

In an organic electroluminescent device having a carrier transport layer and an emitting layer which are composed of an organic material provided between a hole injection electrode and an electron injection electrode, a first organic electroluminescent device according to the present invention is characterized in that a dopant for transporting carriers is doped into the carrier transport layer.

When the carrier transport layer is an electron transport layer, it is possible to dope as the dopant for transporting carriers a dopant having electron transporting properties, a dopant having hole transporting properties, and a dopant having both electron transporting properties and hole transporting properties.

When the dopant having electron transporting properties is doped into the electron transport layer, an electron transporting material superior in film stability, for example, the above-mentioned $Alq_3$ is used as a host material in the electron transport layer, while a dopant having high electron transporting properties is doped into the host material. Consequently, an electron transport layer high in film stability and superior in electron transporting properties is obtained, and electrons in sufficient quantity are transported through the electron transport layer. Accordingly, light having a high luminance is stably emitted. In doping the dopant having high electron transporting properties as described above, the electron transporting properties in the electron transport layer cannot be considerably improved if the amount thereof is small, while stability in the electron transport layer is decreased if the amount thereof is too large. Therefore, it is preferable that the amount of the dopant in the electron transport layer is in the range of 0.01 to 50% by weight.

When the dopant having hole transporting properties is doped into the electron transport layer, holes introduced into the electron transport layer from the emitting layer by the dopant having hole transporting properties are introduced into the electron transport layer. Accordingly, holes are prevented from being stored in the interface between the electron transport layer and the emitting layer. Therefore, the luminescent properties, the life, and the like in the organic electroluminescent device are improved. In thus doping the dopant having hole transporting properties, holes cannot be sufficiently prevented from being stored in the interface between the electron transport layer and the emitting layer if the amount thereof is small, while the electron transporting properties in the electron transport layer are degraded if the amount thereof is too large. Therefore, it is preferable that the amount of the dopant in the electron transport layer is in the range of 0.01 to 50% by weight.

When the carrier transport layer is a hole transport layer, it is possible to dope as the dopant for transporting carriers a dopant having hole transporting properties, a dopant having electron transporting properties, and a dopant having both electron transporting properties and hole transporting properties.

When the dopant having hole transporting properties is doped into the hole transport layer, a hole transporting material superior in film stability is used as a host material in the hole transport layer, while a dopant having high hole transporting properties is doped into the host material. Consequently, a hole transport layer high in film stability and superior in hole transporting properties is obtained, and holes in sufficient quantity are transported through the hole transport layer. Accordingly, light having a high luminance can be stably emitted. In thus doping the dopant having high electron transporting properties, the hole transporting properties in the hole transport layer cannot be considerably improved if the amount thereof is small, while stability in the hole transport layer is decreased if the amount thereof is too large. Therefore, it is preferable that the amount of the dopant in the hole transport layer is in the range of 0.01 to 50% by weight.

When the dopant having electron transporting properties is doped into the hole transport layer, electrons introduced into the hole transport layer from the emitting layer by the dopant having electron transporting properties are introduced into the hole transport layer. Accordingly, electrons are prevented from being stored in the interface between the hole transport layer and the emitting layer. Therefore, the luminescent properties, the life, and the like in the organic electroluminescent device are improved. In thus doping the dopant having electron transporting properties, electrons cannot be sufficiently prevented from being stored in the interface between the hole transport layer and the emitting layer if the amount thereof is small, while the hole transporting properties in the hole transport layer are degraded if the amount thereof is too large. Therefore, it is preferable that the amount of the dopant in the hole transport layer is in the range of 0.01 to 50% by weight.

When the dopant having two properties, that is, electron transporting properties and hole transporting properties is doped as the dopant for transporting carriers into the electron transport layer and the hole transport layer, electrons and holes are transported by the dopant. Therefore, the holes are prevented from being stored in the interface between the electron transport layer and the emitting layer, and the electrons are prevented from being stored in the interface between the hole transport layer and the emitting layer. Therefore, the luminescent properties, the life, and the like in the organic electroluminescent device are improved.

In an organic electroluminescent device having a carrier transport layer and an emitting layer which are composed of an organic material provided between a hole injection electrode and an electron injection electrode, a second organic electroluminescent device according to the present invention is characterized in that a dopant for transporting carriers or moving excitation energy is doped into the emitting layer.

As in the second organic electroluminescent device, when the dopant for transporting carriers or moving excitation energy is doped into the emitting layer, electrons and holes are easy to inject into the emitting layer by the dopant. Therefore, the probability that the electrons and the holes are combined with each other in the emitting layer to emit light is increased. Further, a luminescent material in the emitting layer is efficiently excited, so that light having a high luminance is emitted at a low voltage.

When the dopant for transporting carriers or moving excitation energy does not emit light, only the luminescent material in the emitting layer emits light. Therefore, light in a predetermined color is emitted.

Used as the dopant for transporting carriers or moving excitation energy is one whose energy gap is larger than the energy gap of the luminescent material in the emitting layer. Examples are rubrene, 9,10-diphenyl anthracene, and anthracene which are condensed polycyclic aromatic compounds.

In doping the dopant for transporting carriers or moving excitation energy into the emitting layer, the probability that the electrons and the holes are combined with each other to emit light in the emitting layer is increased, and the luminescent material in the emitting layer cannot be efficiently excited if the amount thereof is small, while the amount of the luminescent material in the emitting layer is decreased, so that light cannot be sufficiently emitted if the amount thereof is too large. Therefore, it is preferable that the amount of the dopant in the emitting layer is in the range of 0.01 to 50% by weight.

In an organic electroluminescent device having a carrier transport layer and an emitting layer which are composed of an organic material provided between a hole injection electrode and an electron injection electrode, a third organic electroluminescent device according to the present invention is characterized in that a dopant having luminescent properties and a dopant for moving excitation energy which assists the dopant having luminescent properties to emit light are doped into the emitting layer.

As in the third organic electroluminescent device, when the dopant having luminescent properties and the dopant for moving excitation energy which assists the dopant having luminescent properties to emit light are doped into the emitting layer, the dopant having luminescent properties is efficiently excited by the dopant for moving excitation energy. Therefore, light having a high luminance can be emitted at a low voltage.

When the dopant for moving excitation energy does not emit light, only the dopant having luminescent properties which is excited by the dopant for moving excitation energy emits light. Therefore, light having a high color purity is obtained.

In doping the dopant having luminescent properties or the dopant for moving excitation energy which assists the dopant having luminescent properties to emit light into the emitting layer, the dopant having luminescent properties which is doped into the emitting layer cannot be efficiently excited, so that sufficient luminance cannot be obtained if the amount thereof is small, while a problem arises in stability or the like in the emitting layer if the amount thereof is too large. Therefore, it is preferable that the amount of the dopant in the emitting layer is in the range of 0.01 to 50% by weight.

In order to emit red light having a high luminance and having a high color purity in the third organic electroluminescent device, a compound, selected from the following structural formulas (3) to (5), having a luminescent peak wavelength in the range of 550 nm to 700 nm, for example, is used as the dopant having luminescent properties, and rubrene is used as the dopant for moving excitation energy.

(3)

(4)

(5)

$R_1$ to $R_7$ in the foregoing structural formulas (3) to (5) are hydrogen or a substituent. Examples of $R_1$ to $R_7$ include —$C_nH_{2n+1}$, —CN, —O($C_nH_{2n+1}$), —N($C_nH_{2n+1}$), a hydrogen group, a phenyl group, and a naphthyl group, where n is an integer of 0 to 10.

The device structure of each of the first to third organic electroluminescent devices in the present invention may be any one of known structures, that is, a DH structure obtained by laminating a hole transport layer, an emitting layer, and an electron transport layer between a hole injection electrode and an electron injection electrode, an SH-A structure obtained by laminating a hole transport layer and an emitting layer between a hole injection electrode and an electron injection electrode, and an SH-B structure obtained by laminating an emitting layer and an electron transport layer between a hole injection electrode and an electron injection electrode.

These and other objects, advantages and features of the invention will become apparent from the following description thereof taken in conjunction with the accompanying drawings which illustrate specific embodiments of the invention.

DESCRIPTION OF THE PREFERRED EMBODIMENTS

An organic electroluminescent device according to an embodiment of the present invention will be specifically described on the basis of the accompanying drawings, and comparative examples will be given, to clarify that the organic electroluminescent device according to the embodiment of the present invention is superior.

EXAMPLE 1

Figure 1:
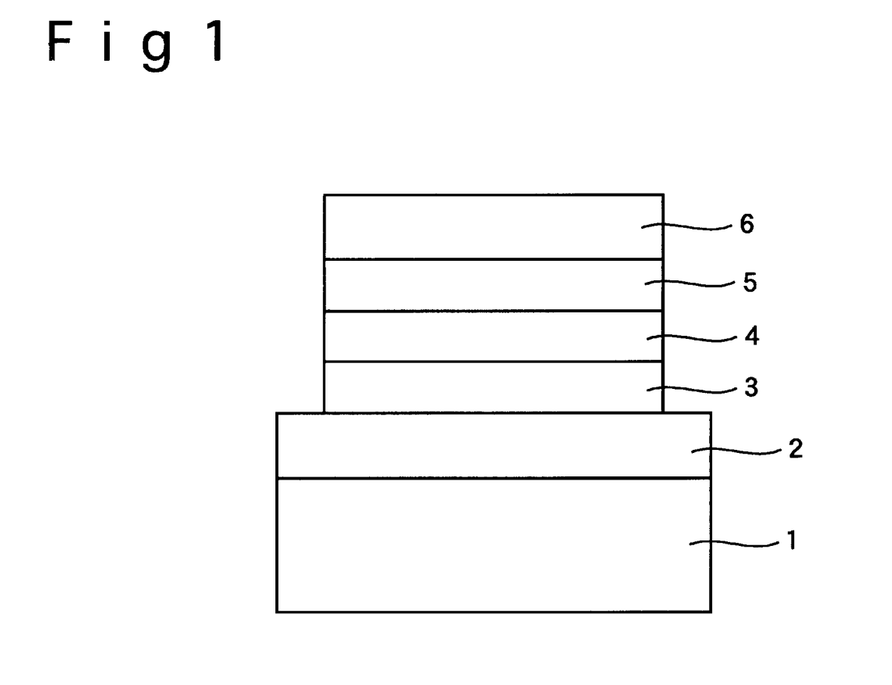
FIG. 1 is a schematic view showing the device structure of each of organic electroluminescent devices in examples 1 and 2 and a comparative example 1.

In an organic electroluminescent device in an example 1, a transparent hole injection electrode 2 composed of an indium-tin oxide (hereinafter abbreviated as ITO) is formed on a glass substrate 1, and a hole transport layer 3 having a thickness of 500 Å composed of 4,4',4"-tris(3-methyphenylphenylamino) triphenylamine (hereinafter abbreviated as MTDATA) indicated by the following structural formula (6) is formed on the hole injection electrode 2, as shown in FIG. 1.

MTDATA (6)

An emitting layer 4 having a thickness of 150 Å obtained by doping, into a host material composed of Bis[N(1-naphthly)-N-phenyl]benzidine(hereinafter abbreviated as NPB) indicated by the following structural formula (7),5% by weight of rubrene indicated by the following structural formula (8) whose energy gap is smaller than that of the NPD is formed on the hole transport layer 3.

NPB (7)

Rubrene (8)

An electron transport layer 5 having a thickness of 350 Å obtained by doping 20% by weight of 9,10-diphenyl anthracene (hereinafter abbreviated as DPA) indicated by the following structural formula (9) as a dopant having electron transporting properties into a host material composed of the $Alq_3$ indicated by the foregoing structural formula (1) is formed on the emitting layer 4.

(9)

DPA

An electron injection electrode 6 having a thickness of 2000 Å composed of an MgIn alloy (Mg:In=10:1) is formed on the electron transport layer 5.

In fabricating the organic electroluminescent device in the example 1, the glass substrate 1 having the transparent hole injection electrode 2 composed of the ITO formed thereon was cleaned by a neutral detergent, was then ultrasonically cleaned in acetone and ethanol, respectively, for twenty minutes and twenty minutes, was further put in boiling ethanol for about one minute and taken out, and was immediately dried by ventilation.

The hole transport layer 3, the emitting layer 4, the electron transport layer 5, and the electron injection electrode 6 were successively formed on the hole injection electrode 2 formed on the glass substrate 1 by vacuum evaporation. The evaporation was performed under conditions in which the substrate temperature is not controlled at a degree of vacuum of $5 \times 10^6$ Torr.

When a voltage was applied from a power supply (not shown) with the hole injection electrode 2 and the electron injection electrode 6 in the organic electroluminescent device in the example 1 respectively connected to the positive and the negative of the power supply, yellow light having a luminance of 301 cd/m² at a voltage of 6 volts and having a luminance of 21900 cd/m² at a voltage of 11 volts was emitted by the rubrene, as shown in the following Table 1.

EXAMPLE 2

An organic electroluminescent device in an example 2 was fabricated in the same manner as the above-mentioned organic electroluminescent device in the example 1 except that the dopant having electron transporting properties to be doped into the electron transport layer 5 in the organic electroluminescent device in the example 1 was changed into anthracene indicated by the following structural formula (10), to form an electron transport layer 5 in which 12.8% by weight of anthracene was doped as the dopant having electron transporting properties into a host material composed of the $Alq_3$.

(10)

Anthracene

When a voltage was applied from a power supply with a hole injection electrode 2 and an electron injection electrode 6 in the organic electroluminescent device in the example 2 respectively connected to the positive and the negative of the power supply, yellow light having a luminance of 131 cd/m² at a voltage of 6 volts and having a luminance of 5020 cd/m² at a voltage of 11 volts was emitted by the rubrene, as shown in the following Table 1.

COMPARATIVE EXAMPLE 1

An organic electroluminescent device in a comparative example was fabricated in the same manner as the above-mentioned organic electroluminescent device in the example 1 except that an electron transport layer 5 was composed of only the $Alq_3$ without doping a dopant thereinto.

When a voltage was applied from a power supply with a hole injection electrode 2 and an electron injection electrode 6 in the organic electroluminescent device in the comparative example 1 respectively connected to the positive and the negative of the power supply, yellow light having a luminance of 27 cd/m² at a voltage of 6 volts and having a luminance of 1739 cd/m² at a voltage of 11 volts was emitted by the rubrene, as shown in the following Table 1.

TABLE 1

| | luminance (cd/m²) | |
|---|---|---|
| voltage | 6 V | 11 V |
| example 1 | 301 | 21900 |
| example 2 | 131 | 5020 |
| comparative example 1 | 27 | 1739 |

As apparent from the results, in each of the organic electroluminescent devices in the examples 1 and 2 in which the dopant having electron transporting properties was doped into the electron transport layer 5 using the $Alq_3$, light having a higher luminance was emitted, as compared with the organic electroluminescent device in the comparative example in which the dopant having electron transporting properties was not doped into the electron transport layer 5. Particularly in the organic electroluminescent device in the example 1 using the DPA as the dopant having electron transporting properties, the luminance was not less than ten times that in the organic electroluminescent device in the comparative example 1.

In doping the dopant having electron transporting properties into the electron transport layer 5 as in each of the organic electroluminescent devices in the examples 1 and 2, when the amount of the dopant having electron transporting properties exceeded 50% by weight, the electron transporting properties in the electron transport layer 5 was inversely degraded. The reason for this is conceivably that the amount of the dopant was too large, so that the film quality of the electron transport layer 5 was lowered.

EXAMPLE 3

Figure 2:
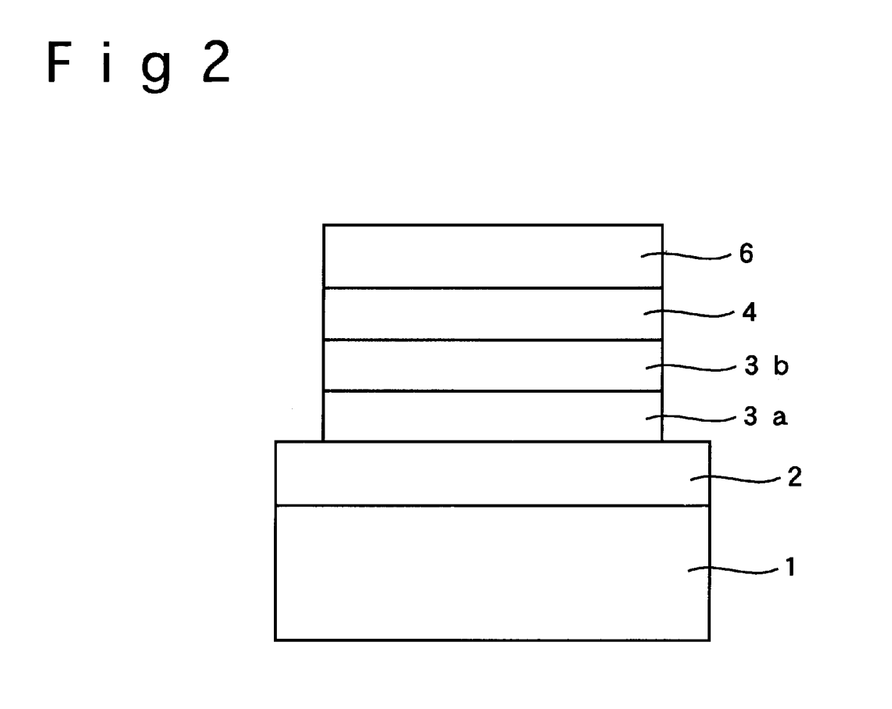
FIG. 2 is a schematic view showing the device structure of each of organic electroluminescent devices in examples 3 to 16 and comparative examples 2 to 9.

In an organic electroluminescent device in an example 3, a transparent hole injection electrode 2 composed of the ITO is formed on a glass substrate 1, a first hole transport layer 3a having a thickness of 500 Å composed of the MTDATA indicated by the foregoing structural formula (6) is formed on the hole injection electrode 2, and a second hole transport layer 3b having a thickness of 100 Å obtained by doping 10% by weight of the DPA indicated by the foregoing structural formula (9) as a dopant having electron transporting properties into a host material having hole transporting properties composed of the TPD indicated by the foregoing structural formula (2) is formed on the first hole transport layer 3a, as shown in FIG. 2.

An emitting layer 4 having a thickness of 500 Å obtained by doping 10% by weight of the DPA indicated by the foregoing structural formula (9) as a dopant having electron transporting properties into a host material composed of the $Alq_3$ indicated by the foregoing structural formula (1) is formed on the second hole transport layer 3b, and an electron injection electrode 6 having a thickness of 2000 Å composed of an MgIn alloy (Mg:In=10:1) is formed on the emitting layer 4.

When a voltage was applied from a power supply with the hole injection electrode 2 and the electron injection electrode 6 in the organic electroluminescent device in the example 3 respectively connected to the positive and the negative of the power supply, green light having a luminescent peak wavelength of 510 nm was emitted by the $Alq_3$ in the emitting layer 4, and the emission of light by the DPA (having a luminescent peak wavelength of 438 nm) whose energy gap is larger than that of the $Alq_3$ was not observed.

When the voltage applied from the power supply was changed, light having a luminance of 487 $cd/m^2$ at a voltage of 6 volts and having a luminance of 24000 $cd/m^2$ at a voltage of 11 volts was emitted, as shown in the following Table 2.

Furthermore, in the organic electroluminescent device, when the initial voltage was set to 6.3 volts, and light was continuously emitted at a predetermined current of 13.6 $mA/cm^2$ such that the initial luminance would be 500 $cd/m^2$, the luminance after 517 hours was 273 $cd/m^2$ which is about 55% of the initial luminance, as shown in the following Table 2.

EXAMPLE 4

An organic electroluminescent device in an example 4 was fabricated in the same manner as the above-mentioned organic electroluminescent device in the example 3 except that 10% by weight of the DPA which is a dopant having electron transporting properties was doped into a host material having hole transporting properties composed of the TPD in a second hole transport layer 3b, while the DPA which is a dopant having electron transporting properties was not doped into the $Alq_3$ in an emitting layer 4.

When a voltage was applied from a power supply with a hole injection electrode 2 and an electron injection electrode 6 in the organic electroluminescent device in the example 4 respectively connected to the positive and the negative of the power supply, green light was emitted by the $Alq_3$ in the emitting layer 4, as in the organic electroluminescent device in the example 3.

When the voltage applied from the power supply was changed, light having a luminance of 142 $cd/m^2$ at a voltage of 6 volts and having a luminance of 12160 $cd/m^2$ at a voltage of 11 volts was emitted, as shown in the following Table 2.

Furthermore, in the organic electroluminescent device, when the initial voltage was set to 7.6 volts, and light was continuously emitted at a predetermined current of 15.6 $mA/cm^2$ such that the initial luminance would be 500 $cd/m^2$, the luminance after 517 hours was 201 $cd/m^2$ which is about 40% of the initial luminance, as shown in the following Table 2.

COMPARATIVE EXAMPLE 2

An organic electroluminescent device in a comparative example 2 was fabricated in the same manner as the above-mentioned organic electroluminescent device in the example 3 except that the DPA which is a dopant having electron transporting properties was not doped into a host material having hole transporting properties composed of the TPD in a second hole transport layer 3b, and the DPA which is a dopant having electron transporting properties was not also doped into the $Alq_3$ in an emitting layer 4.

When a voltage was applied from a power supply with a hole injection electrode 2 and an electron injection electrode 6 in the organic electroluminescent device in the comparative example 2 respectively connected to the positive and the negative of the power supply, green light was emitted by the $Alq_3$ in the emitting layer 4, as in the organic electroluminescent device in the example 3.

When the voltage applied from the power supply was changed, light having a luminance of 112 $cd/m^2$ at a voltage of 6 volts and having a luminance of 10150 $cd/m^2$ at a voltage of 11 volts was emitted, as shown in the following Table 2.

Furthermore, in the organic electroluminescent device, when the initial voltage was set to 8.0 volts, and light was continuously emitted at a predetermined current of 16.8 $mA/cm^2$ such that the initial luminance would be 500 $cd/m^2$, the luminance was decreased to one-half the initial luminance in about 25 hours. The luminance was not more than 10% of the initial luminance after 517 hours, in which state light was hardly emitted, as shown in the following Table 2.

TABLE 2

| | luminance ($cd/m^2$) | | after 517 hours (initial luminance (500 $cd/m^2$)) | |
|---|---|---|---|---|
| voltage | 6 V | 11 V | luminance ($cd/m^2$) | ratio to initial luminance |
| example 3 | 487 | 24000 | 273 | 55% |
| example 4 | 142 | 12160 | 201 | 40% |
| comparative example 2 | 112 | 10150 | hardly emit light | not more than 10% |

As apparent from the results, in the organic electroluminescent device in the example 4 in which the DPA which is a dopant having electron transporting properties was doped into only the second hole transport layer 3b, and the organic electroluminescent device in the example 3 in which the DPA which is a dopant having electron transporting properties was doped into both the second hole transport layer 3b and the emitting layer 4, light having a higher luminance was emitted, and the light was stably emitted over a longer time period, as compared with the organic electroluminescent device in the comparative example 2 in which the DPA which is a dopant having electron transporting properties was doped into neither the second hole transport layer 3b nor the emitting layer 4.

Particularly in the organic electroluminescent device in the example 3 in which the DPA which is a dopant having electron transporting properties was doped into both the second hole transport layer 3b and the emitting layer 4, light having a higher luminance was emitted, and the light was stably emitted over a longer time period.

EXAMPLE 5

In an organic electroluminescent device in an example 5, a transparent hole injection electrode 2 composed of the ITO is formed on a glass substrate 1, a first hole transport layer 3a having a thickness of 500 Å composed of the MTDATA indicated by the foregoing structural formula (6) is formed on the hole injection electrode 2, and a second hole transport layer 3b having a thickness of 100 Å composed of the TPD indicated by the foregoing structural formula (2) is formed on the first hole transport layer 3a, as shown in FIG. 2.

An emitting layer 4 having a thickness of 400 Å obtained by doping 1.6% by weight of DCM1 indicated by the following structural formula (11) as a dopant having luminescent properties and 5% by weight of the rubrene indicated by the foregoing structural formula (8) as a dopant for moving excitation energy and transporting electrons which assists the DCM1 to emit light into a host material composed of the $Alq_3$ indicated by the foregoing structural formula (1) is formed on the second hole transport layer 3b, and an electron injection electrode 6 having a thickness of 2000 Å composed of an MgIn alloy (Mg:In=10:1) is formed on the emitting layer 4.

DCM1 (11)

When a voltage is applied from a power supply with the hole injection electrode 2 and the electron injection electrode 6 in the organic electroluminescent device in the example 5 respectively connected to the positive and the negative of the power supply, orange light having a luminescent peak wavelength of 611 nm and having values of 0.562 and 0.419 as x and y chromaticity coordinates was emitted by the DCM1 in the emitting layer 4, and the emission of light by the rubrene (having a luminescent peak wavelength of 656 nm) was not observed.

When the voltage applied from the power supply was changed, light having a luminance of 60 cd/m$^2$ at a voltage of 6 volts and having a luminance of 2190 cd/m$^2$ at a voltage of 11 volts was obtained, as shown in the following Table 3.

Furthermore, in the organic electroluminescent device, when light was continuously emitted at a predetermined current of 9 mA/cm$^2$ such that the initial luminance would be 166 cd/m$^2$, the luminance after 305 hours was about 62% of the initial luminance, as shown in the following Table 3.

EXAMPLE 6

An organic electroluminescent device in an example 6 was fabricated in the same manner as the above-mentioned organic electroluminescent device in the example 5 except that the amount of the rubrene to be doped into the emitting layer 4 in the organic electroluminescent device in the example 5 was changed into 10% by weight.

When a voltage was applied from a power supply with a hole injection electrode 2 and an electron injection electrode 6 in the organic electroluminescent device in the example 6 respectively connected to the positive and the negative of the power supply, orange light having a luminescent peak wavelength of 607 nm and having values of 0.562 and 0.437 as x and y chromaticity coordinates was only emitted by the DCM1, and the emission of light by the rubrene was not observed, as in the organic electroluminescent device in the example 5.

When the voltage applied from the power supply was changed, light having a luminance of 60 cd/m$^2$ at a voltage of 6 volts and having a luminance of 1915 cd/m$^2$ at a voltage of 11 volts was emitted, as shown in the following Table 3.

Furthermore, in the organic electroluminescent device, when light was continuously emitted at a predetermined current of 9 mA/cm$^2$ such that the initial luminance would be 211 cd/m$^2$, the luminance after 305 hours was about 64% of the initial luminance, as shown in the following Table 3.

COMPARATIVE EXAMPLE 3

An organic electroluminescent device in a comparative example 3 was fabricated in the same manner as the above-mentioned organic electroluminescent device in the example 5 except that the rubrene was not doped into an emitting layer 4.

When a voltage was applied from a power supply with a hole injection electrode 2 and an electron injection electrode 6 in the organic electroluminescent device in the comparative example 3 respectively connected to the positive and the negative of the power supply, orange light having a luminescent peak wavelength of 611 nm and having values of 0.553 and 0.438 as x and y chromaticity coordinates was emitted by the DCM1.

When the voltage applied from the power supply was changed, light having a luminance of 30 cd/m$^2$ at a voltage of 6 volts and having a luminance of 1279 cd/m$^2$ at a voltage of 11 volts was emitted, as shown in the following Table 3.

Furthermore, in the organic electroluminescent device, when light was continuously emitted at a predetermined current of 9 mA/cm$^2$ such that the initial luminance would be 222 cd/m$^2$, the luminance after 305 hours was about 32% of the initial luminance, as shown in the following Table 3.

TABLE 3

| voltage | luminance (cd/m$^2$) | | ratio of luminance after 305 hours to initial luminance |
|---|---|---|---|
| | 6 V | 11 V | (%) |
| example 5 | 60 | 2190 | 62 |
| example 6 | 60 | 1915 | 64 |
| comparative example 3 | 30 | 1279 | 32 |

As apparent from the results, in each of the organic electroluminescent devices in the examples 5 and 6 in which the DCM1 which is a dopant having electron transporting properties and the rubrene which is a dopant for moving excitation energy and transporting electrons which assists the DCM1 to emit light were doped into the emitting layer 4, light having a higher luminance was emitted, and the light was stably emitted over a longer time period, as compared with the organic electroluminescent device in the comparative example 3 in which the rubrene which is a dopant for moving excitation energy and transporting electrons which assists the DCM1 to emit light was not doped.

EXAMPLE 7

In an organic electroluminescent device in an example 7, a transparent hole injection electrode 2 composed of the ITO is formed on a glass substrate 1, a first hole transport layer 3a having a thickness of 500 Å composed of the MTDATA indicated by the foregoing structural formula (6) is formed on the hole injection electrode 2, and a second hole transport layer 3b having a thickness of 100 Å composed of the TPD indicated by the foregoing structural formula (2) is formed on the first hole transport layer 3a, as shown in FIG. 2.

An emitting layer 4 having a thickness of 400 Å obtained by doping 1% by weight of Nile Red indicated by the following structural formula (12) as a dopant having luminescent properties and 10% by weight of the rubrene indicated by the foregoing structural formula (8) as a dopant for moving excitation energy and transporting electrons which assists the Nile Red to emit light into a host material composed of the $Alq_3$ indicated by the foregoing structural formula (1) is formed on the second hole transport layer 3b, and an electron injection electrode 6 having a thickness of 2000 Å composed of an MgIn alloy (Mg:In=10:1) is formed on the emitting layer 4.

(12)

Nile Red

Figure 3:
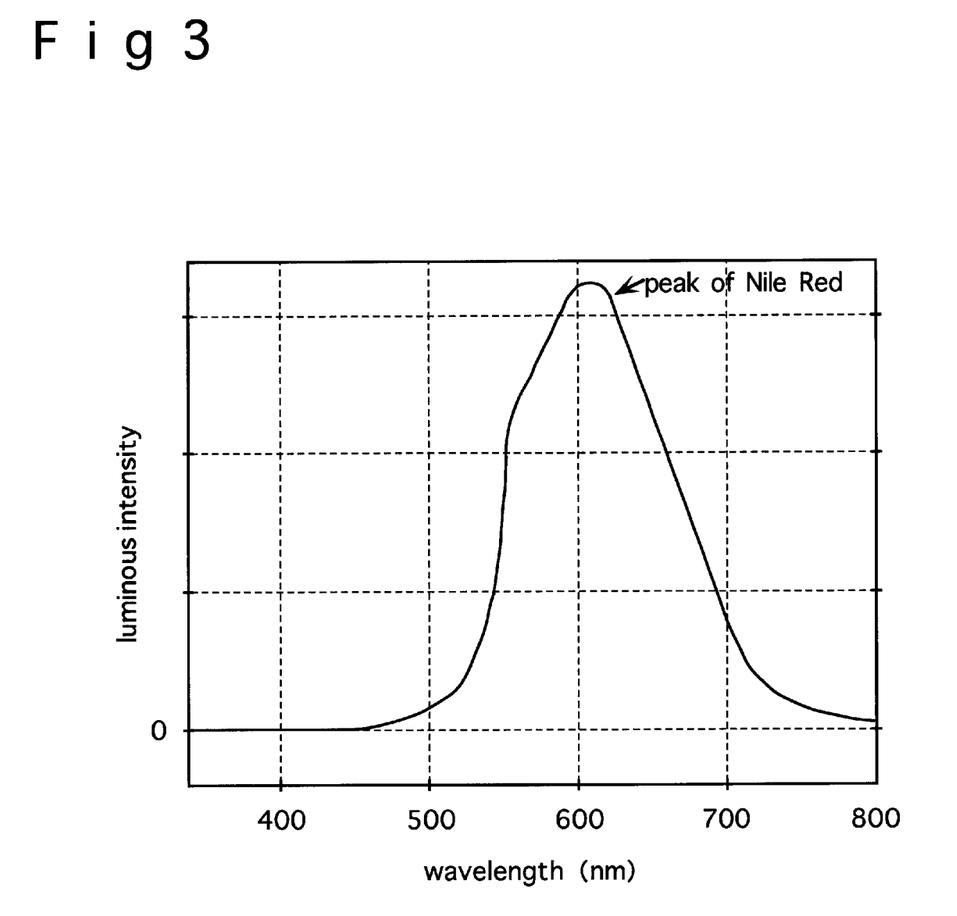
FIG. 3 is a diagram showing an emission spectrum in the organic electroluminescent device in the example 7.

When a voltage was applied from a power supply with the hole injection electrode 2 and the electron injection electrode 6 in the organic electroluminescent device in the example 7 respectively connected to the positive and the negative of the power supply, orange light having a luminescent peak wavelength of about 612 nm, as shown in FIG. 3, and having values of 0.530 and 0.464 as x and y chromaticity coordinates was emitted by the Nile Red, and the emission of light by the rubrene and the $Alq_3$ in the emitting layer 4 was not observed.

When the voltage applied from the power supply was changed, light having a luminance of 51 cd/m² at a voltage of 6 volts and having a luminance of 2170 cd/m² at a voltage of 11 volts was emitted, as shown in the following Table 4.

Furthermore, in the organic electroluminescent device, when light was continuously emitted at a predetermined current of 9 mA/cm² such that the initial luminance would be 140 cd/m², the luminance after 544 hours was about 55% of the initial luminance, as shown in the following Table 3.

COMPARATIVE EXAMPLE 4

An organic electroluminescent device in a comparative example 4 was fabricated in the same manner as the above-mentioned organic electroluminescent device in the example 5 except that the rubrene was not doped into a host material composed of the $Alq_3$ in an emitting layer 4.

Figure 4:
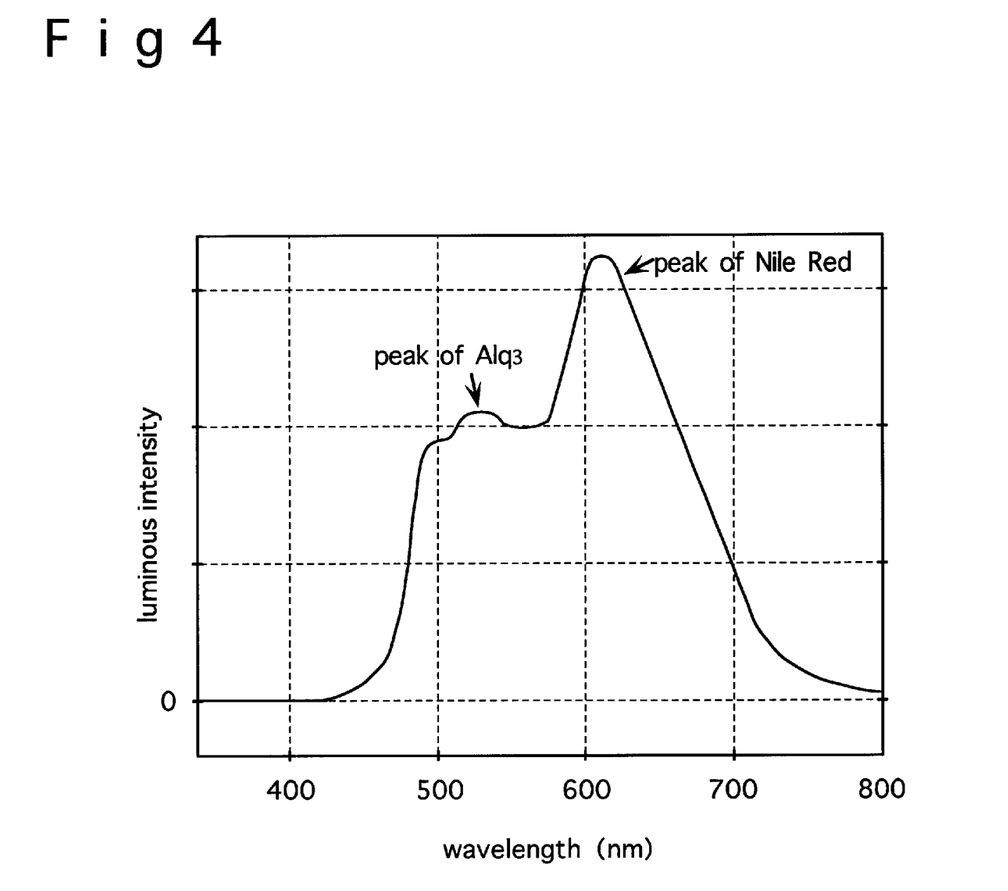
FIG. 4 is a diagram showing an emission spectrum in the organic electroluminescent device in the comparative example 4.

When a voltage was applied from a power supply with a hole injection electrode 2 and an electron injection electrode 6 in the organic electroluminescent device in the comparative example 4 respectively connected to the positive and the negative of the power supply, pale orange light having luminescent peak wavelengths of 615 nm and 535 nm, as shown in FIG. 4, and having values of 0.449 and 0.489 as x and y chromaticity coordinates was emitted, and both the Nile Red and the $Alq_3$ in the emitting layer 4 emitted light. The reason for this was that excitation energy was not satisfactorily moved from the $Alq_3$ to the Nile Red because the rubrene was not doped into the emitting layer 4, so that the $Alq_3$ itself emitted light.

When the voltage applied from the power supply was changed, light having a luminance of 22 cd/m² at a voltage of 6 volts and having a luminance of 1424 cd/M² at a voltage of 11 volts was emitted, as shown in the following Table 4.

Furthermore, in the organic electroluminescent device, when light was continuously emitted at a predetermined current of 9 mA/cm² such that the initial luminance would be 115 cd/m², the luminance after 544 hours was about 23% of the initial luminance, as shown in the following Table 4.

TABLE 4

| | luminance (cd/m²) | | ratio of luminance after 544 hours to initial luminance |
|---|---|---|---|
| voltage | 6 V | 11 V | (%) |
| example 7 | 51 | 2170 | 55 |
| comparative example 4 | 22 | 1424 | 23 |

As apparent from the results, in the organic electroluminescent device in the example 7 in which the Nile Red which is a dopant having luminescent properties as well as the rubrene which is a dopant for moving excitation energy and transporting electrons which assists the Nile Red to emit light were doped into the emitting layer 4, the rubrene and the $Alq_3$ did not emit light, and only the Nile Red emitted light. Therefore, light having a higher color purity and having a higher luminance was emitted, and the light was stably emitted over a longer time period, as compared with the organic electroluminescent device in the comparative example 4 in which the rubrene which is a dopant for moving excitation energy and transporting electrons which assists the Nile Red to emit light was not doped.

EXAMPLE 8

In an organic electroluminescent device in an example 8, a transparent hole injection electrode 2 composed of the ITO is formed on a glass substrate 1, a first hole transport layer 3a having a thickness of 500 Å composed of the MTDATA indicated by the foregoing structural formula (6) is formed on the hole injection electrode 2, and a second hole transport layer 3b having a thickness of 100 Å composed of the TPD indicated by the foregoing structural formula (2) is formed on the first hole transport layer 3a, as shown in FIG. 2.

An emitting layer 4 having a thickness of 400 Å obtained by doping 1% by weight of DCM2 indicated by the following structural formula (13) as a dopant having luminescent properties and 10% by weight of the rubrene indicated by the foregoing structural formula (8) as a dopant for moving excitation energy and transporting electrons for moving excitation energy and transporting electrons which assists the DCM2 to emit light into a host material composed of the Alq$_3$ indicated by the foregoing structural formula (1) is formed on the second hole transport layer 3b, and an electron injection electrode 6 having a thickness of 2000 Å composed of an MgIn alloy (Mg:In=10:1) is formed on the emitting layer 4.

(13)

DCM2

When a voltage was applied from a power supply with the hole injection electrode 2 and the electron injection electrode 6 in the organic electroluminescent device in the example 8 respectively connected to the positive and the negative of the power supply, red light having a luminescent peak wavelength of 645 nm and having values of 0.650 and 0.350 as x and y chromaticity coordinates was only emitted by the DCM2 in the emitting layer 4, and the emission of light by the rubrene and the Alq$_3$ in the emitting layer 4 was not observed.

The luminance in a case where the voltage applied from the power supply was set to 6 volts was 20 cd/M$^2$, and the highest luminance was 7050 cd/m$^2$.

COMPARATIVE EXAMPLE 5

An organic electroluminescent device in a comparative example 5 was fabricated in the same manner as the above-mentioned organic electroluminescent device in the example 8 except that the rubrene was not doped into a host material composed of the Alq$_3$ in an emitting layer 4.

When a voltage was applied from a power supply with a hole injection electrode 2 and an electron injection electrode 6 in the organic electroluminescent device in the comparative example 5 respectively connected to the positive and the negative of the power supply, red light having a luminescent peak wavelength of 645 nm and having values of 0.612 and 0.382 as x and y chromaticity coordinates was emitted by the DCM2.

The luminance in a case where the voltage applied from the power supply was set to 6 volts was 13 cd/m$^2$, and the highest luminance was 4020 cd/m$^2$.

As a result, when the DCM2 which is a dopant having luminescent properties as well as the rubrene which is a dopant for moving excitation energy and transporting electrons which assists the DCM2 to emit light were doped into the host material composed of the Alq$_3$ in the emitting layer 4, as in the above-mentioned example 8, the rubrene did not emit light, and the luminous efficiency of the DCM2 which is a dopant having luminescent properties was increased. Accordingly, light having a high luminance was emitted by the DCM2, and light was sufficiently emitted at a low voltage. Therefore, the life of the organic electroluminescent device could be improved.

EXAMPLE 9

In an organic electroluminescent device in an example 9, a transparent hole injection electrode 2 composed of ITO is formed on a glass substrate 1, a first hole transport layer 3a having a thickness of 500 Å composed of the MTDATA indicated by the foregoing structural formula (6) is formed on the hole injection electrode 2, and a second hole transport layer 3b having a thickness of 100 Å composed of the TPD indicated by the foregoing structural formula (2) is formed on the first hole transport layer 3a, as shown in FIG. 2.

An emitting layer 4 having a thickness of 400 Å obtained by doping 1.6% by weight of the DCM1 indicated by the foregoing structural formula (11) as a dopant having luminescent properties and 10% by weight of the DPA indicated by the foregoing structural formula (9) as a dopant for moving transporting electrons into a host material composed of the Alq$_3$ indicated by the foregoing structural formula (1) was formed on the second hole transport layer 3b, and an electron injection electrode 6 having a thickness of 2000 Å composed of an MgIn alloy (Mg:In=10:1) was formed on the emitting layer 4.

When a voltage was applied from a power supply with the hole injection electrode 2 and the electron injection electrode 6 in the organic electroluminescent device in the example 9 respectively connected to the positive and the negative of the power supply, orange light having a luminescent peak wavelength of 605 nm and having values of 0.537 and 0.447 as x and y chromaticity coordinates was emitted by the DCM1 in the emitting layer 4, and the emission of light by the DPA and the Alq$_3$ in the emitting layer 4 was not observed.

The luminance in a case where the voltage applied from the power supply was set to 6 volts was 417 cd/m$^2$, and the highest luminance was 12180 cd/m$^2$, so that light having a high luminance was emitted by the DCM1, and the light was sufficiently emitted at a low voltage. Therefore, the life of the organic electroluminescent device could be improved.

EXAMPLE 10

In an organic electroluminescent device in an example 10, a transparent hole injection electrode 2 composed of the ITO is formed on a glass substrate 1, a first hole transport layer 3a having a thickness of 200 Å composed of copper phthalocyanine (hereinafter abbreviated as CuPc) indicated by the following structural formula (14) is formed on the hole injection electrode 2, and a second hole transport layer 3b having a thickness of 100 Å obtained by doping 10% by weight of an oxadiazole derivative (hereinafter abbreviated as OXD8) indicated by the following structural formula (15) as a dopant having electron transporting properties and hole transporting properties into a host material having hole transporting properties composed of the NPB indicated by the foregoing structural formula (7) is formed on the first hole transport layer 3a, as shown in FIG. 2.

CuPc (14)

OXD8 (15)

An emitting layer 4 having a thickness of 500 Å composed of the $Alq_3$ indicated by the foregoing structural formula (1) is formed on the second hole transport layer 3b, and an electron injection electrode 6 having a thickness of 2000 Å composed of an MgIn alloy (Mg:In=10:1) is formed on the emitting layer 4.

When a voltage was applied from a power supply with the hole injection electrode 2 and the electron injection electrode 6 in the organic electroluminescent device in the example 10 respectively connected to the positive and the negative of the power supply, green light having a luminescent peak wavelength of 527 nm and having values of 0.271 and 0.602 as x and y chromaticity coordinates was emitted by the $Alq_3$ in the emitting layer 4.

When the voltage applied to the organic electroluminescent device from the power supply was raised, the emission of light was started at a voltage of 3.3 volts. The luminance in a case where the voltage was set to 6 volts was 128 cd/m², and the highest luminance was 33700 cd/m².

COMPARATIVE EXAMPLE 6

An organic electroluminescent device in a comparative example 6 was fabricated in the same manner as the above-mentioned organic electroluminescent device in the example 10 except that the OXD8 was not doped into a host material having hole transporting properties composed of the NPB in a second hole transport layer 3b.

When a voltage was applied from a power supply with a hole injection electrode 2 and an electron injection electrode 6 in the organic electroluminescent device in the comparative example 6 respectively connected to the positive and the negative of the power supply, green light having a luminescent peak wavelength of 527 nm and having values of 0.301 and 0.612 as x and y chromaticity coordinates was emitted by the $Alq_3$ in the emitting layer 4.

When the voltage applied to the organic electroluminescent device from the power supply was raised, the emission of light was started at a voltage of 3.7 volts. The luminance in a case where the voltage was set to 6 volts was 77 cd/m², and the highest luminance was 21100 cd/m².

As a result, when the OXD8 having electron transporting properties and hole transporting properties was doped into a host material having hole transporting properties composed of the NPB in a second hole transport layer 3b, as in the above-mentioned example 10, light having a high luminance was emitted, and the emission of the light was started at a low voltage, so that the light was sufficiently emitted at a low voltage. Therefore, the life of the organic electroluminescent device could be improved.

The reason for this is conceivably that the luminous efficiency of electrons and holes into the second hole transport layer 3b was increased by doping the OXD8 having electron transporting properties and hole transporting properties into the second hole transport layer 3b.

EXAMPLES 11 TO 16

In each of organic electroluminescent devices in examples 11 to 16, a transparent hole injection electrode 2 composed of the ITO is formed on a glass substrate 1, a first hole transport layer 3a having a thickness of 200 Å composed of the CuPc indicated by the foregoing structural formula (14) is formed on the hole injection electrode 2, and a second hole transport layer 3b having a thickness of 100 Å composed of the NPB indicated by the foregoing structural formula (7) is formed on the first hole transport layer 3a, as shown in FIG. 2

An emitting layer 4 having a thickness of 500 Å obtained by respectively doping the DCM2 indicated by the foregoing structural formula (13) which is a dopant having luminescent properties and the rubrene which is a dopant for moving excitation energy and transporting electrons which assists the DCM2 to emit light in the respective proportions shown in the following Table 5 into a host material composed of the $Alq_3$ indicated by the foregoing structural formula (1) is formed on the second hole transmitting layer 3b, and an electron injection electrode 6 having a thickness of 2000 Å composed of an MgIn alloy (Mg:In=10:1) is formed on the emitting layer 4.

In each of organic electroluminescent devices in comparative examples 7 to 9 was produced in the same manner as the above-mentioned organic electroluminescent devices in the examples 11 to 16 except that the DCM2 which is a dopant having luminescent properties was doped in the proportion shown in the following Table 5, while the rubrene which is a dopant for moving excitation energy and transporting electrons which assists the DCM2 to emit light was not doped.

|  | amount of dopant in emitting layer | |
|---|---|---|
|  | DCM2(% by weight) | rubrene(% by weight) |
| example 11 | 2 | 3 |
| example 12 | 2 | 5 |
| example 13 | 2 | 10 |
| example 14 | 1 | 3 |
| example 15 | 1 | 5 |
| example 16 | 7 | 7 |
| comparative example 7 | 2 | 0 |
| comparative example 8 | 1 | 0 |

-continued

| | amount of dopant in emitting layer | |
|---|---|---|
| | DCM2(% by weight) | rubrene(% by weight) |
| comparative example 9 | 7 | 0 |

When a voltage was applied from a power supply with a hole injection electrode 2 and an electron injection electrode 6 in each of the organic electroluminescent devices in the examples 11 to 16 and the comparative examples 7 to 9 respectively connected to the positive and the negative of the power supply, to emit light. In each of cases where the luminance was 100 cd/m$^2$ and 1000 cd/m$^2$, the values of x and y chromaticity coordinates of the emitted light were found, and the highest luminance was measured. The results thereof were shown in the following Table 6.

TABLE 6

| | chromaticity coordinates | | highest luminance |
|---|---|---|---|
| | 100 cd/m$^2$ | 1000 cd/m$^2$ | (cd/m$^2$) |
| example 11 | x = 0.65, y = 0.35 | x = 0.64, y = 0.36 | 7,840 |
| example 12 | x = 0.64, y = 0.36 | x = 0.64, y = 0.36 | 7,780 |
| example 13 | x = 0.64, y = 0.36 | x = 0.63, y = 0.37 | 9,470 |
| comparative example 7 | x = 0.62, y = 0.38 | x = 0.61, y = 0.38 | 7,130 |
| example 14 | x = 0.62, y = 0.38 | x = 0.60, y = 0.39 | 12,700 |
| example 15 | x = 0.59, y = 0.41 | x = 0.57, y = 0.42 | 14,080 |
| comparative example 8 | x = 0.57, y = 0.42 | x = 0.54, y = 0.44 | 12,600 |
| example 16 | x = 0.65, y = 0.35 | x = 0.64, y = 0.36 | 1,900 |
| comparative example 9 | x = 0.61, y = 0.38 | x = 0.61, y = 0.38 | 2,430 |

Comparison was made between the organic electroluminescent devices which are the same in the amount of the DCM2 to be doped into the host material composed of the Alq$_3$ in the emitting layer 4. In the organic electroluminescent device in the example in which the rubrene which is a dopant for moving excitation energy and transporting electrons which assists the DCM2 to emit light was doped, light closer to red was emitted, as compared with the organic electroluminescent device in the corresponding comparative example in which the rubrene was not doped.

In each of the organic electroluminescent devices in the example 13 in which 2% by weight of the DCM2 and 10% by weight of the rubrene were doped into the host material composed of the Alq$_3$ in the emitting layer 4 and the organic electroluminescent device in the comparative example 7 in which 2% by weight of the DCM2 was only doped into the host material composed of the Alq$_3$ in the emitting layer 4 and the rubrene was not doped, an emission spectrum was measured. The results thereof were shown in FIG. 5.

Figure 5:
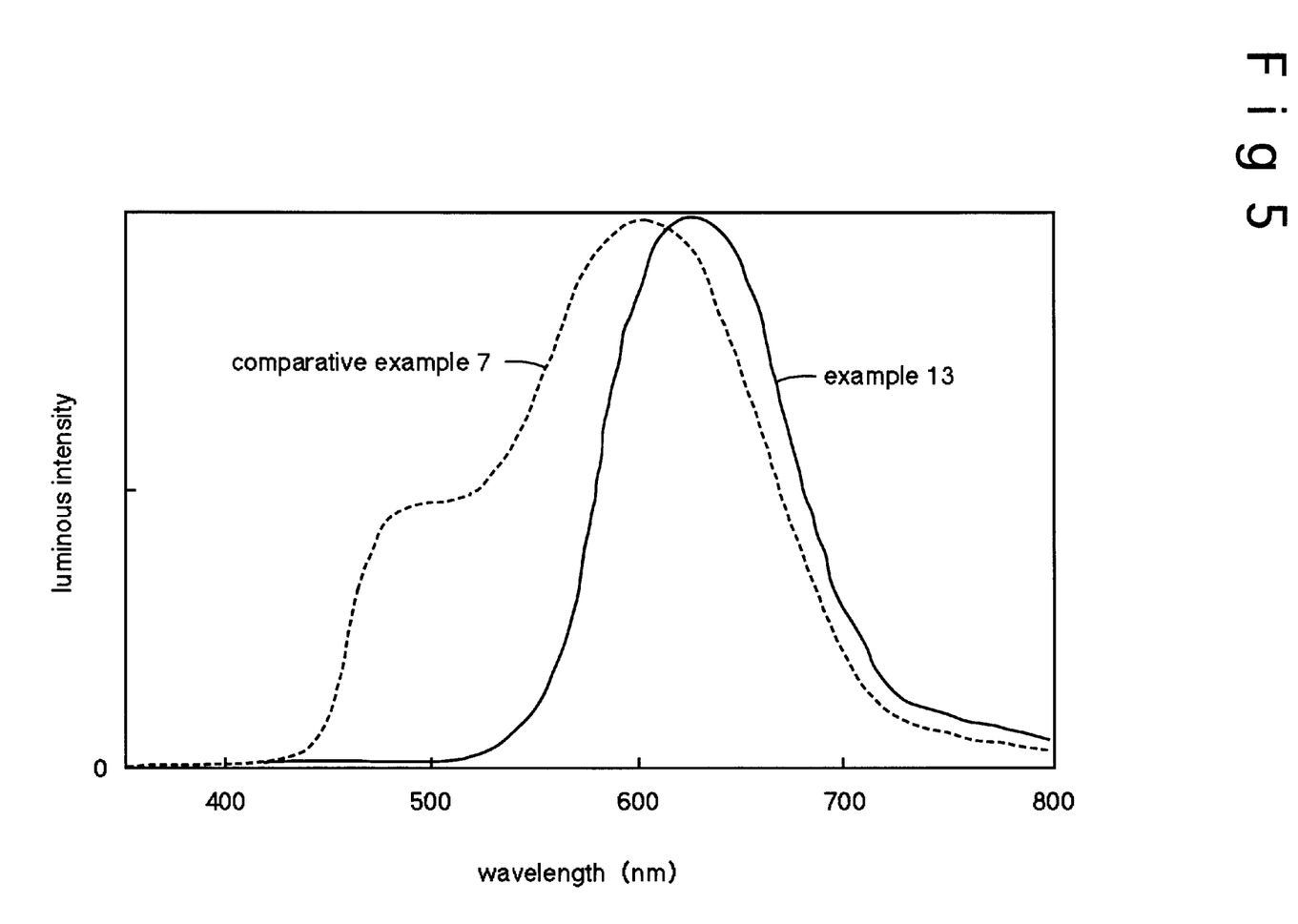
FIG. 5 is a diagram showing respective emission spectrums in the organic electroluminescent devices in the example 13 and the comparative example 7.

As a result, in the organic electroluminescent device in the comparative example 7 in which the rubrene was not doped, light was emitted by the Alq$_3$ in the vicinity of a wavelength of 520 nm in addition to light emitted by the DCM2. On the other hand, in the organic electroluminescent device in the example 13 in which the rubrene which assists the DCM2 to emit light was doped, light was not emitted by the Alq$_3$, and light was emitted only by the DCM2 having a luminescent peak wavelength of about 644 nm. The reason for this is conceivably that excitation energy is smoothly moved from the Alq$_3$ to the DCM2 through the rubrene.

The organic electroluminescent devices in the examples 11 to 13 and the comparative example 7 in which 2% by weight of the DCM2 which is a dopant having luminescent properties was doped were compared in luminance in a case where a voltage of 10 volts was applied. As a result, the luminance in the organic electroluminescent device in the example 12 in which the amount of the rubrene to be doped was set to 5% by weight is the highest. Therefore, it was preferable that the amount of the rubrene to be doped was set to 5% by weight.

In a case where comparison was made among the organic electroluminescent devices in the examples 11 to 16, the luminance in the organic electroluminescent devices in the examples 14 and 15 in which the amount of the DCM2 which is a dopant having luminescent properties was set to 1% by weight was high. On the other hand, light emitted in the organic electroluminescent devices in the examples 14 and 15 was in an orangish color rather than red. The reason for this is conceivably that the amount of the DCM2 was small, so that the Alq$_3$ and the rubrene which have a high luminous efficiency emitted light.

On the other hand, in the organic electroluminescent device in the example 16 in which the amount of the DCM which is a dopant having luminescent properties was set to 7% by weight, red light was emitted. However, the luminance was low because the luminous efficiency of the DCM2 was low.

Contrary to this, in the organic electroluminescent devices in the examples 11 to 13 in which the amount of the DCM2 which is a dopant having luminescent properties was set to 2% by weight, light being red and having a high luminance was emitted. Therefore, it was preferable that the amount of the DCM2 was set to 2% by weight.

In the organic electroluminescent device in the example 12 in which 2% by weight of the DCM2 was doped, and 5% by weight of the rubrene was doped, and the organic electroluminescent device in the comparative example 7 in which 2% by weight of the DCM2 was only doped, and the rubrene was not doped, the changes in the chromaticity coordinates in cases where the luminance was set to 100 cd/m$^2$ and 1000 cd/m$^2$ were examined. As a result, in both the cases, the chromaticity coordinates hardly changed.

When the luminance was set to 4000 cd/m$^2$, however, the values of x and y chromaticity coordinates of light emitted from the organic electroluminescent device in the comparative example 7 were respectively 0.59 and 0.40, so that the emitted light was in a color closer to orange. The reason for this is conceivably that in a case where the voltage applied to the organic electroluminescent device in the comparative example 7 was raised to increase the luminance, the Alq$_3$ emitted light in addition to the DCM2.

Contrary to this, in the organic electroluminescent device in the example 12, even in a case where the luminance was set to 4000 cd/m$^2$, the values of x and y chromaticity coordinates of the emitted light were respectively x=0.64 and y=0.36. Therefore, the chromaticity coordinates hardly changed, so that red light was emitted. The reason for this is that the excitation energy was smoothly moved from the Alq$_3$ to the DCM2 through the rubrene, as described above, by doping the rubrene, so that only the DCM2 emitted light even in a case where the voltage applied to the organic electroluminescent device was raised to increase the luminance.

In the organic electroluminescent device in the example in which the DCM2 which is a dopant having luminescent properties as well as the rubrene which assists the DCM2 to emit light were doped, therefore, red light having a high color purity was emitted even in a case where the applied voltage was raised to increase the luminance.

Although the present invention has been fully described by way of examples, it is to be noted that various changes and modifications will be apparent to those skilled in the art.

Therefore, unless otherwise such changes and modifications depart from the scope of the present invention, they should be construed as being included therein.

What is claimed is:

1. An organic electroluminescent device having a carrier transport layer and an emitting layer which are composed of an organic material provided between a hole injection electrode and an electron injection electrode, wherein a first dopant having luminescent properties and a second dopant which assists the first dopant having luminescent properties to emit light are doped into said emitting layer, wherein said second dopant does not emit light.

2. The organic electroluminescent device according to claim 1, wherein the amount of each of said first dopant having luminescent properties and said second dopant in said emitting layer is in the range of 0.01% by weight to 50% by weight.

3. The organic electroluminescent device according to claim 1, wherein the luminescent peak wavelength of said first dopant having luminescent properties is in the range of 550 nm to 700 nm.

4. The organic electroluminescent device according to claim 1, wherein said first dopant having luminescent properties is selected from compounds indicated by the following three structural formulas, where $R_1$ to $R_7$ in said structural formulas is hydrogen or a substituent (3)

(4)

(5)

5. The organic electroluminescent device according to claim 1, wherein said second dopant is rubrene.

* * * * *